United States Patent [19]
Walck

[11] Patent Number: 6,051,989
[45] Date of Patent: Apr. 18, 2000

[54] ACTIVE TERMINATION OF A CONDUCTOR FOR BI-DIRECTIONAL SIGNAL TRANSMISSION

[75] Inventor: Jeffrey Alan Walck, Lebanon, N.J.

[73] Assignee: Lucent Technologies Inc., Murray Hill, N.J.

[21] Appl. No.: 09/076,212

[22] Filed: May 12, 1998

Related U.S. Application Data

[60] Provisional application No. 60/048,128, May 30, 1997.

[51] Int. Cl.[7] .................. H03K 19/003; H03K 19/0175; H01P 1/26
[52] U.S. Cl. ............................. 326/30; 326/30; 326/86; 326/82; 333/22 R
[58] Field of Search .............................. 326/30, 83, 82, 326/86, 90, 56, 57; 333/22 R

[56] References Cited

U.S. PATENT DOCUMENTS

| | | | |
|---|---|---|---|
| 4,748,426 | 5/1988 | Stewart | 333/22 R |
| 5,029,284 | 7/1991 | Feldbaumer et al. | 326/30 |
| 5,111,080 | 5/1992 | Mizukami et al. | 326/30 |
| 5,510,727 | 4/1996 | Culmer et al. | 326/30 |
| 5,686,872 | 11/1997 | Fried et al. | 333/22 R |
| 5,705,937 | 1/1998 | Yap | 326/30 |
| 5,731,711 | 3/1998 | Gabara | 326/30 |
| 5,959,489 | 9/1999 | Walck | 327/333 |

Primary Examiner—Michael Tokar
Assistant Examiner—James H. Cho
Attorney, Agent, or Firm—David L. Smith

[57] ABSTRACT

There is disclosed, an active termination circuit includes a transmitter adapted to be coupled to a bidirectional conductor, a receiver also adapted to be coupled to the bidirectional conductor, a first impedance adapted to be switched to couple to the bidirectional conductor to match the input impedance of the receiver to a characteristic impedance of the bidirectional conductor to which it is adapted to be coupled when the receiver is in the receive mode, and a second impedance adapted to be switched to couple the bidirectional conductor to match the output impedance of the transmitter to the characteristic impedance of the bidirectional conductor to which it is adapted to be coupled when the transmitter is in the transmit mode.

31 Claims, 4 Drawing Sheets

6,051,989

ACTIVE TERMINATION OF A CONDUCTOR FOR BI-DIRECTIONAL SIGNAL TRANSMISSION

Priority of U.S. Provisional Application Ser. No: 60/048,128 filed May 30, 1997 is hereby claimed.

TECHNICAL FIELD

This application relates to termination of conductors over which signals are transmitted, and in particular to active termination of conductors over which signals are transmitted bi-directionally.

BACKGROUND OF THE INVENTION

Conductors over which digital signals are transmitted must be properly terminated in order to prevent overshoot, undershoot, and reflections. These effects, when caused by impedance mismatch, become more pronounced as the length of the conductor increases, and limit the rate at which data can be transmitted over a conductor. The conductor can be a trace on an integrated circuit, a trace on a board, or a wire in a cable. Furthermore, a conductor may include one or more such components. The impedance of both the source and load should be matched to the characteristic impedance of the conductor. Since the output impedance of the transmitter and the input impedance of the receiver generally differ from the characteristic impedance of a conductor that interconnects the transmitter and receiver, it is necessary to alter the existing impedance differently at the source and load ends of the conductor. When the conductor is used for bidirectional signal transmission, each end of a conductor is a source or a load at different times. A single impedance alteration does not provide the correct impedance matching for both transmission.

One known technique for solving impedance mismatch is disclosed in U.S. Pat. No. 4,748,426 which teaches permanently connecting one end of each of a pair of resistors to a wire in a cable for coupling a plurality of peripheral devices to each other. The other end of the resistors are connected through unidirectional switching devices to a positive voltage supply line and to logic ground, respectively. While this technique can be used to match the input impedance of the receiver to the characteristic impedance of the wire, it does not provide for matching the output impedance of a transmitter to the characteristic impedance of the cable wire. Furthermore, due to the resistors being permanently connected to the wire, this technique does not accommodate bidirectional signal transmission.

What is needed is an improved termination technique that matches the impedance of both a transmitter and receiver to the characteristic impedance of a conductor to which they are coupled during the time each is active.

SUMMARY OF THE INVENTION

In accordance with the present invention, an active termination circuit includes a transmitter adapted to be coupled to a bidirectional conductor, a receiver also adapted to be coupled to the bidirectional conductor, a first impedance adapted to be switched to couple to the bidirectional conductor to match the input impedance of the receiver to a characteristic impedance of the bidirectional conductor to which it is adapted to be coupled when the receiver is in the receive mode, and a second impedance adapted to be switched to couple the bidirectional conductor to match the output impedance of the transmitter to the characteristic impedance of the bidirectional conductor to which it is adapted to be coupled when the transmitter is in the transmit mode.

DETAILED DESCRIPTION

Figure 1:
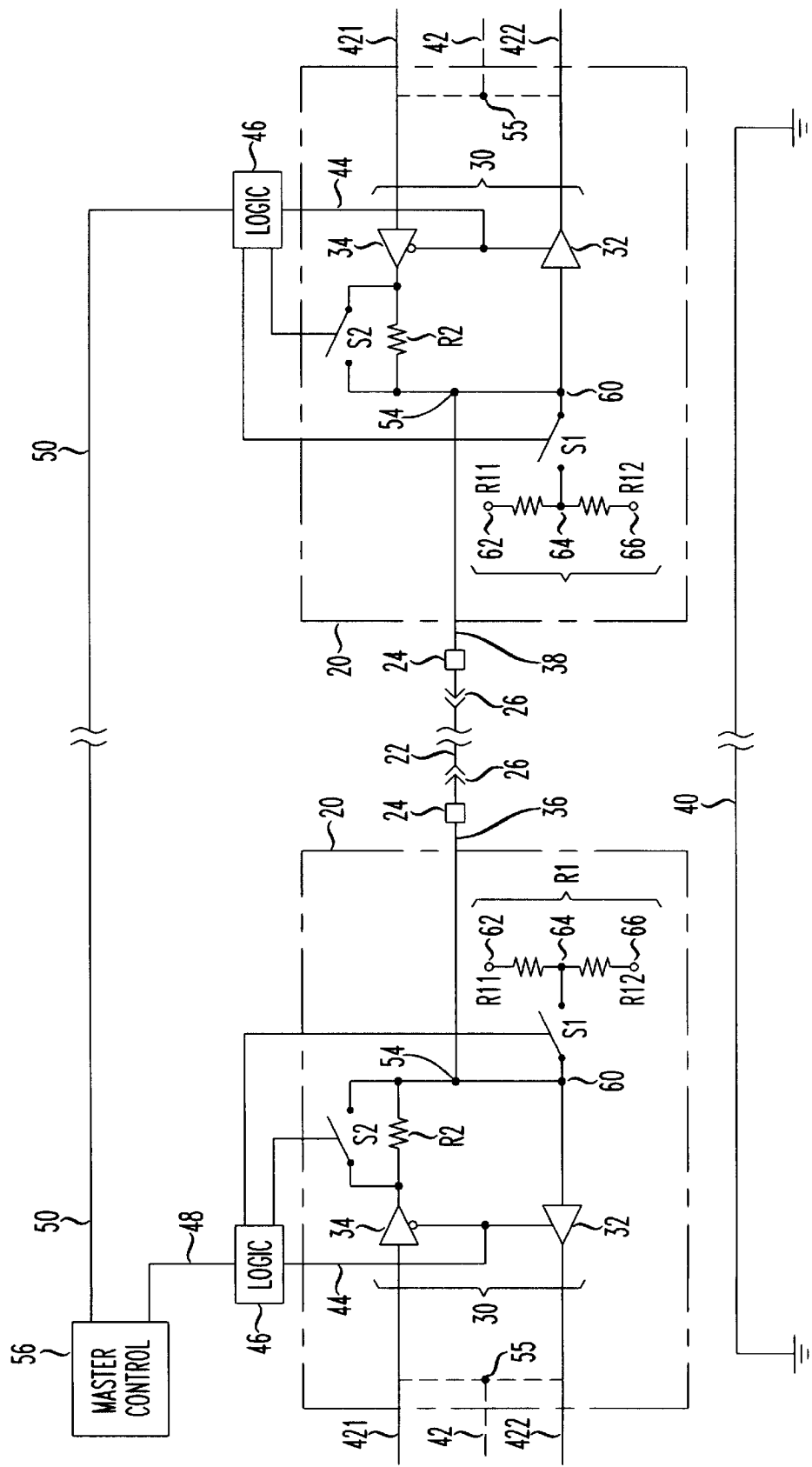
FIG. 1 is a schematic diagram of a transmit-receive pair at each end of a conductor adapted for active termination in both the transmit and receive modes, including an active termination circuit in accordance with the present invention.

FIG. 1 is a schematic diagram of an illustrative embodiment active termination circuit 20 for bidirectional signal transmission, in accordance with the present invention, on each end of a bidirectional conductor 22. Bidirectional conductor 22 may be comprised of, for example, a conductive path on an integrated circuit, a trace on a circuit board, or a conductor in a cable, or any combination thereof. Bidirectional conductor 22 may include interface devices such as pads 24 and connectors 26. In the embodiment illustrated in FIG. 1, bidirectional conductor 22 extends from node 54 of active termination circuit 20 at first end 36 to node 54 of active termination circuit 20 at second end 38.

Active termination circuit 20, in the embodiment shown in FIG. 1, includes a transceiver pair 30 comprised of receiver 32 and transmitter 34. The input to transmitter 34 is provided on bus 421 and the output from receiver 32 is provided on bus 422. As shown in phantom in FIG. 1, the input to transmitter 34 and the output from receiver 32 may be provided to a bidirectional bus 42 coupled to node 55. Both receiver 32 and transmitter 34 could each be, for example, a 74LS244 device. Circuit 20 also includes first impedance R1, first switch S1, second impedance R2, and second switch S2. It is preferable that an active termination circuit 20 be coupled to each of first and second ends 36 and 38, respectively, of bidirectional conductor 22. A conductor 40, which may be similar to bidirectional conductor 22, provides a common return path to the active termination circuit 20 coupled to first and second ends of bidirectional conductor 22. Conductor 40 could provide a common return path for multiple bidirectional conductors 22 and active termination circuits 20.

The output of receiver 32 and the input of transmitter 34 are coupled to buses 421 and 422, or to bidirectional bus 42. The output of transmitter 34 and the input of receiver 32 are coupled to bidirectional conductor 22. Logic 46 provides a direction control signal on direction control line 44 to determine which of transmitter 34 or receiver 32 is active. The direction control signal, when in a first state such as low, directs transmitter 34 to transmit, that is impress on bidirectional conductor 22 the signal presented on bus 421 or bidirectional bus 42. When the direction control signal is in the first state, receiver 32 is idle. Direction control line 44, when in a second state such as high, directs receiver 32 to impress on bidirectional bus 42 the signal presented on bidirectional conductor 22. When direction control line 44 is in the second state, transmitter 34 is idle. Direction control line 44 is coupled to logic 46 which, in turn, is coupled by bus 48 or 50 to a master controller 56. Master controller 56 determines which circuit 20 at one end of bidirectional conductor 22 is in receive mode and which circuit 20 at the other end of bidirectional conductor 22 is in transmit mode. A control signal may be provided on bus 48 with, for example, the inverse provided on bus 50, to provide a direction control signal to circuit 20 at the second end 38 of bidirectional conductor 22 by way of logic 46 and directional control line 44. Bus 50 may include a cable conductor which need not be bidirectional and may be unidirectional.

In this manner, logic 46 at each end of bidirectional conductor 22 may be identical, although the invention is not limited thereto. Typically the transmitter 34 at one, a first, end of bidirectional conductor 22 will transmit while the receiver 32 at the other, a second, end of bidirectional conductor 22 receives. Direction of signal transmission on bidirectional conductor 22 can be changed rapidly. By way of example, direction of signal transmission may be reversed in one-tenth of the time required for transmission of a single bit of data over bidirectional conductor 22. Reversing the direction of signal transmission requires reversing the transceiver pair at both ends of bidirectional conductor 22. On occasion, the transceiver pair 30 at both ends of bidirectional conductor 22 may be in the receive mode simultaneously.

In accordance with the invention, active termination circuit 20 reduces reflections and other signal deteriorating effects of signals transmitted over bidirectional conductor 22, thereby permitting data rates transmitted over bidirectional conductor 22 to increase over data rates that could be transmitted absent the termination circuit 20. As shown in FIG. 1, receiver 32 and transmitter 34 are illustrated as separate physical devices with inputs and outputs independently accessible, at points where they are not coupled to bidirectional conductor 22 at node 54 or bidirectional bus 42 at node 55.

A first impedance, R1, is coupled to node 60 at the input to receiver 32. Preferably, first impedance R1 is comprised of a first resistance, R11, coupled between a first reference voltage node 62, such as $V_{DD}$, and a common node 64, and a second resistance R12 coupled between the common node 64 and a second reference voltage node 66, such as ground. The magnitude of impedances R11 and R12 are selected such that the terminating impedance matches the characteristic impedance of bidirectional conductor 22. Impedance R1 and its components, first resistance R11 and second resistance R12, may be generated in any known manner.

A first switch, S1, isolates impedance R1 from node 60 when in a first state such as being opened, and couples impedance R1 to node 60 when in a second state, such as being closed. Switch S1, which is a high speed electronic switch such as a transistor, is illustrated coupled between node 60 and node 64, although the invention is not limited thereto. Any configuration to isolate first impedance R1 from node 60, or to modify impedance R1, will suffice. For example, only one of resistors R11 or R12 needs to be effectively removed from the circuit to sufficiently change the resulting impedance.

A second impedance, R2, is coupled between the output of transmitter 34 and node 54. A second switch, S2, is coupled across second impedance R2 to short across second impedance R2 and thereby couple the output of transmitter 34 to node 54 when the second switch is in a first state such as being closed, and to couple the output of transmitter 34 to node 54 through second impedance R2 when the second switch is in a second state such as being opened.

Operation of switches S1 and S2 at a first end 36 of bidirectional conductor 22 are coordinated with each other, and with the operation of switches S1 and S2 at the second end 38 of bidirectional conductor 22. Switches S1 and S2 may be controlled by logic 46 or by other methods. As described herein, first impedance R1 is switched to be coupled to node 60 when receiver 32 is in the receive mode, and is switched to isolate impedance R1 from node 60 when receiver 32 is not in the receive mode. There may be benefit to impedance R1 being coupled to node 60 when transceiver pair 30 is in neither the transmit nor the receive modes. With impedance R1 coupled to node 60 when transceiver pair 30 is in neither the transmit or receive mode, the overall impedance is reduced and the characteristic impedance is maintained. Second impedance R2 is switched to couple the output of transmitter 34 to node 54 through second impedance R2 when transmitter 34 is in the transmit mode, and is switched to couple the output of transmitter 34 to node 54 shorting across or bypassing second impedance R2 when transmitter 34 is not in the transmit mode.

The following is an explanation of the operation of the circuit illustrated in the schematic diagram of FIG. 1, including active termination circuit 20. To transmit data from first end 36 of bidirectional cable 22 to second end 38, master control 56 provides a signal on bus 48 to logic 46 at the first end 36 of bidirectional conductor 22 to control active termination circuit 20 for transmit pair 30 to transmit. Switch S1 is opened to isolate first impedance R1 from node 60 and hence from bidirectional conductor 22. Switch S2 is opened placing second impedance R2 in series with the output of transmitter 34 to match the output impedance of transmitter 34 to the characteristic impedance of bidirectional conductor 22.

Conditions for receiving at the second end 38 of bidirectional conductor may be set-up at any time relative to setting-up conditions for transmitting at the first end 36, but generally will be set-up simultaneously. At the second end 38 of bidirectional conductor 22, the inverse of the signal on bus 48, or a separate signal provided by master controller 56 impressed on conductor 50 provides a control signal to logic 46 proximate second and 38 to control active termination circuit 20. Logic 46 provides a direction control signal on direction control line 44 for transceiver pair 30 of active termination circuit 20 at the second end 38 to receive data transmitted on bidirectional conductor 22. Switch S1 is closed to couple first impedance R1 to node 60 and bidirectional conductor 22. Switch S2 is closed to short across second impedance R2. Information is then transmitted over bidirectional conductor 22 from transceiver pair 30 at first end 36 and is received by transceiver pair 30 at second end 38.

To transmit data from second end 38 of bidirectional conductor 22 to first end 36, master control 56 provides a signal on bus 48 to logic 46 at the first end of bidirectional conductor 22 for transceiver pair 30 to receive. Switch S1 is closed to couple first impedance R1 to node 60 to match the input impedance of receiver 32 to the characteristic impedance of bidirectional conductor 22. Switch S2 is also closed to short across second impedance R2. Simultaneously at the second end 38 of bidirectional conductor 22, the inverse of the signal on bus 48 as provided by inverter 50 or a separate signal from master control 56 is impressed on conductor 52 to provide a control signal to logic 46 to control active termination circuit 20. Logic 46 proximate the second end 38 provides a signal to transceiver pair 30 of active termination circuit 20 at second end 38 to transmit data presented on bus 42 onto bidirectional conductor 22. Switch S1 is opened to isolate first impedance R1 from bidirectional conductor 22 and Switch S2 is opened placing second impedance R2 in series with bidirectional conductor 22 to match the output impedance of transmitter 34 to the characteristic impedance of bidirectional conductor 22.

Second impedance R2 is used when transmitter 34 of transceiver pair 30 is in the transmit mode. When receiver 32 of transceiver pair 30 is in the receive mode, second impedance R2 is seen by a signal as additional input impedance to receiver 32. The impedance of second impedance R2 generally is 100 ohms or less. Since the input impedance of receiver 32 is two orders of magnitude, or more, greater than the impedance of second impedance R2, it is not necessary to switch second impedance R2 in and out. R2 may be left in the transmit-receive path, obviating the need for switches S2, S2' and S2".

Second impedance R2 is used when transmitter 34 of transceiver pair 30 is in the transmit mode. When receiver 32 of transceiver pair 30 is in the receive mode, second impedance R2 is seen by a signal as additional input impedance to receiver 32. The impedance of second impedance R2 generally is 100 ohms or less. Since the input impedance of receiver 32 is two orders of magnitude, or more, greater than the impedance of R2, it is not necessary to switch second impedance R2 in and out. Second impedance R2 may be left in the transmit-receive path, obviating the need for switches S2, S2' and S2".

Figure 2:
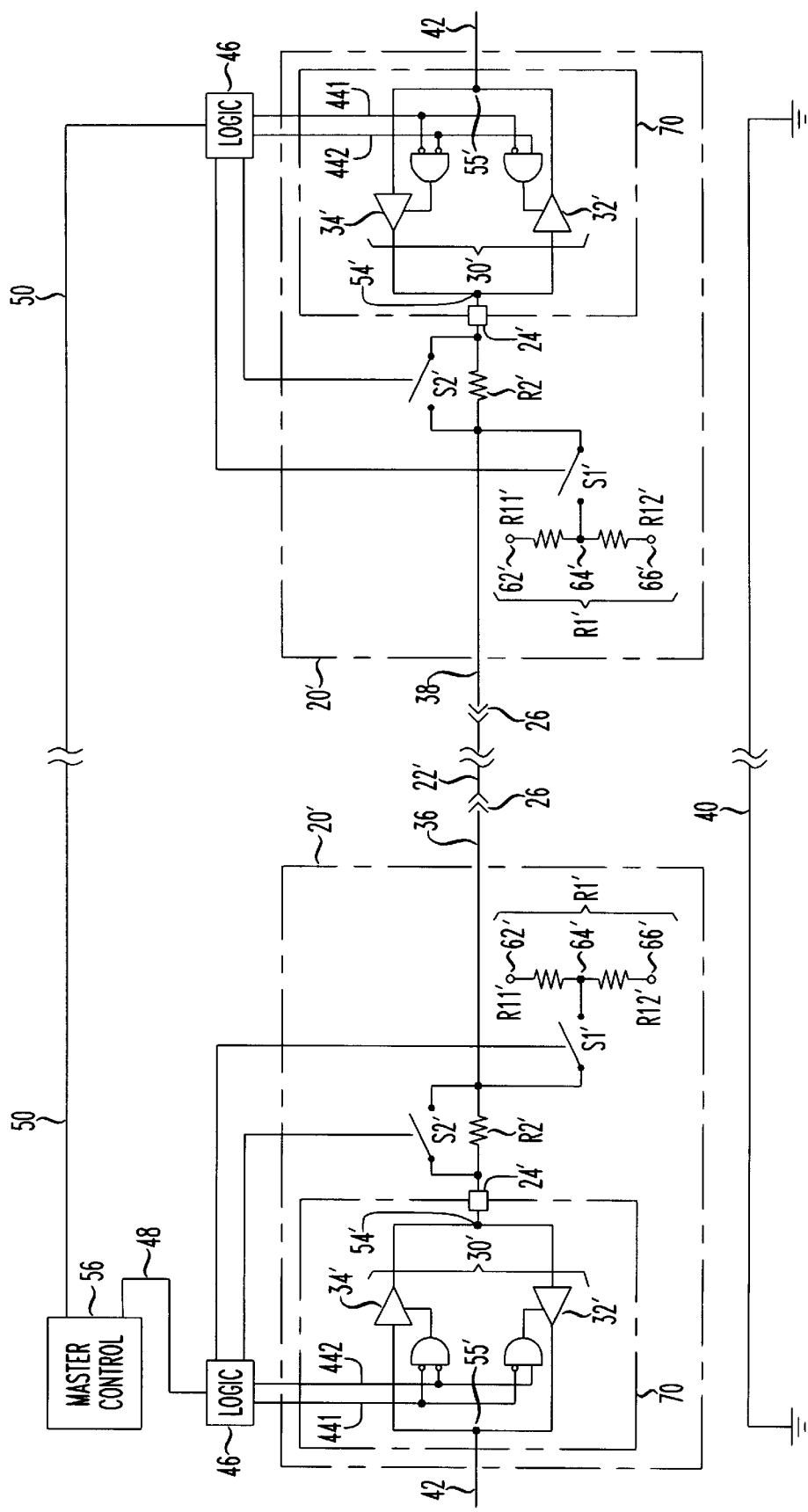
FIG. 2 is a schematic diagram of an alternative embodiment active termination circuit.

FIG. 2 is a schematic diagram illustrating an alternative embodiment of the invention. In the alternative embodiment, a reference numeral with a prime represents a similar element to the element of the FIG. 1 embodiment. In the alternative embodiment, the input of receiver 32' and the output of transmitter 34' are not independently accessible, such as due to being packaged in package 70. Receiver-transmitter pairs of this type that are commercially available include, but are not limited to, transistor-transistor logic (TTL) three-state buffers such as 74LS245 three-state TTL buffers. The input of receiver 32' and the output of transmitter 34' are commoned such as at node 54'. Conductor 441 provides an enable signal for the transceiver pair 30'. Conductor 442 provides a direction signal for the transceiver pair 30'. A truth table is shown in Table 1 in which x=the state does not matter (don't care).

TABLE 1

Operation of Transceiver Pair 30'

| operation | enable | direction |
|---|---|---|
| transmit | 0 | 0 |
| receive | 0 | 1 |
| off | 1 | X |

Transmitter 34' and receiver 32' are shown active low, however the invention is not limited thereto. When enable is low and the direction signal on conductor 442 is in a first state, such as a logic high, transmitter 34' is enabled.

When enable is low and the direction signal on conductor 442 is in a second state, such as a logic low, receiver 32' is enabled. When enable is high, both transmitter 34' and receiver 32' are disabled without regard to the state of the direction signal.

In the alternative illustrative embodiment, bidirectional conductor 22' extends from node 54' of active termination circuit 20' at first end 36 to node 54' of active termination circuit 20' at second end 38. In the alternative embodiment illustrated in FIG. 2, an active termination circuit 20' provides both first impedance R1' and second impedance R2' coupled to node 54'. The common node 64' between first resistance R1' and second resistance R12' of first impedance R1' is coupled through switch S1' to bidirectional conductor 22' at node 72 proximate node 54'. Also coupled to node 54' and node 72, and in series with bidirectional conductor 22', is second impedance R2' with switch S2' in parallel therewith. The magnitudes of impedances R1' and R2' are selected so the input impedance of receiver 32' and the output impedance of transmitter 34', respectively, closely match the characteristic impedance of bidirectional conductor 22'. Impedance values R1' and R2' may differ from impedances R1 and R2. Operation of the embodiment illustrated in FIG. 2 should be readily understood based on the above explanation of the operation of the embodiment illustrated in FIG. 1.

Figure 3:
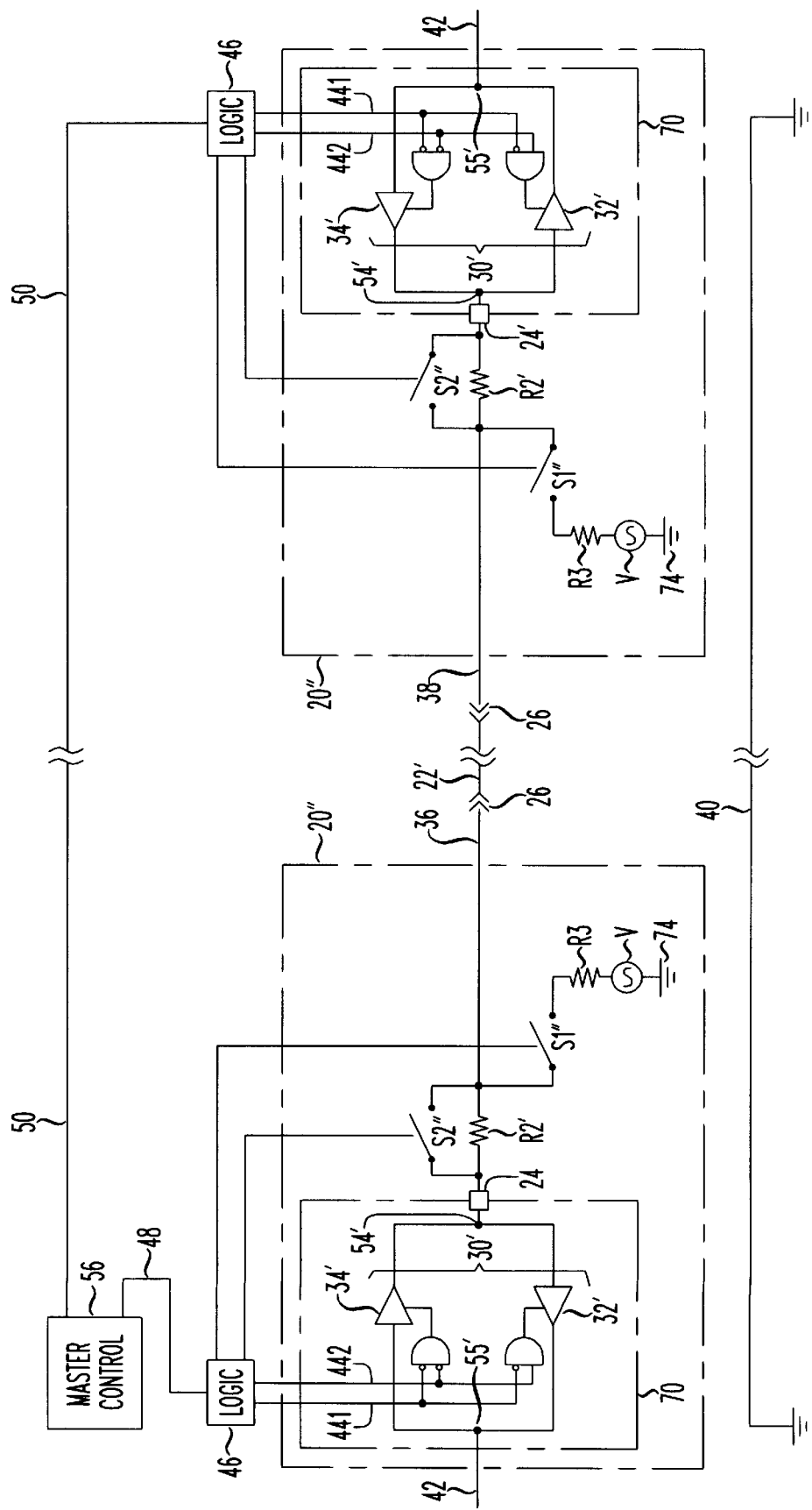
FIG. 3 is a schematic diagram of another alternative embodiment active termination circuit.

FIG. 3 illustrates an active termination circuit 20" including an alternative technique for generating the first impedance that may be used with either of the embodiments of active termination circuits illustrated in FIGS. 1 and 2. The first and second impedances R1 and R2, as well as impedances R1' and R2' may be achieved in any known manner. In FIG. 3, switch S1" is coupled in series with an impedance R3 and a voltage source V, such as a direct current voltage source, between node 72' and a reference voltage 74, such as ground. Impedance R3 can be an impedance equal to the parallel combination of impedances R11 and R12 in the embodiment of FIG. 1. The voltage source V represents the voltage at node 64 in FIG. 1, produced from voltages at nodes 62 and 66 in FIG. 1 and the voltage-divider effect of impedances R11 and R12. The power supply that provides reference voltages could be provided from the same source that powers logic 46. Alternatively the power supply could be provided over another conductor.

Figure 4:
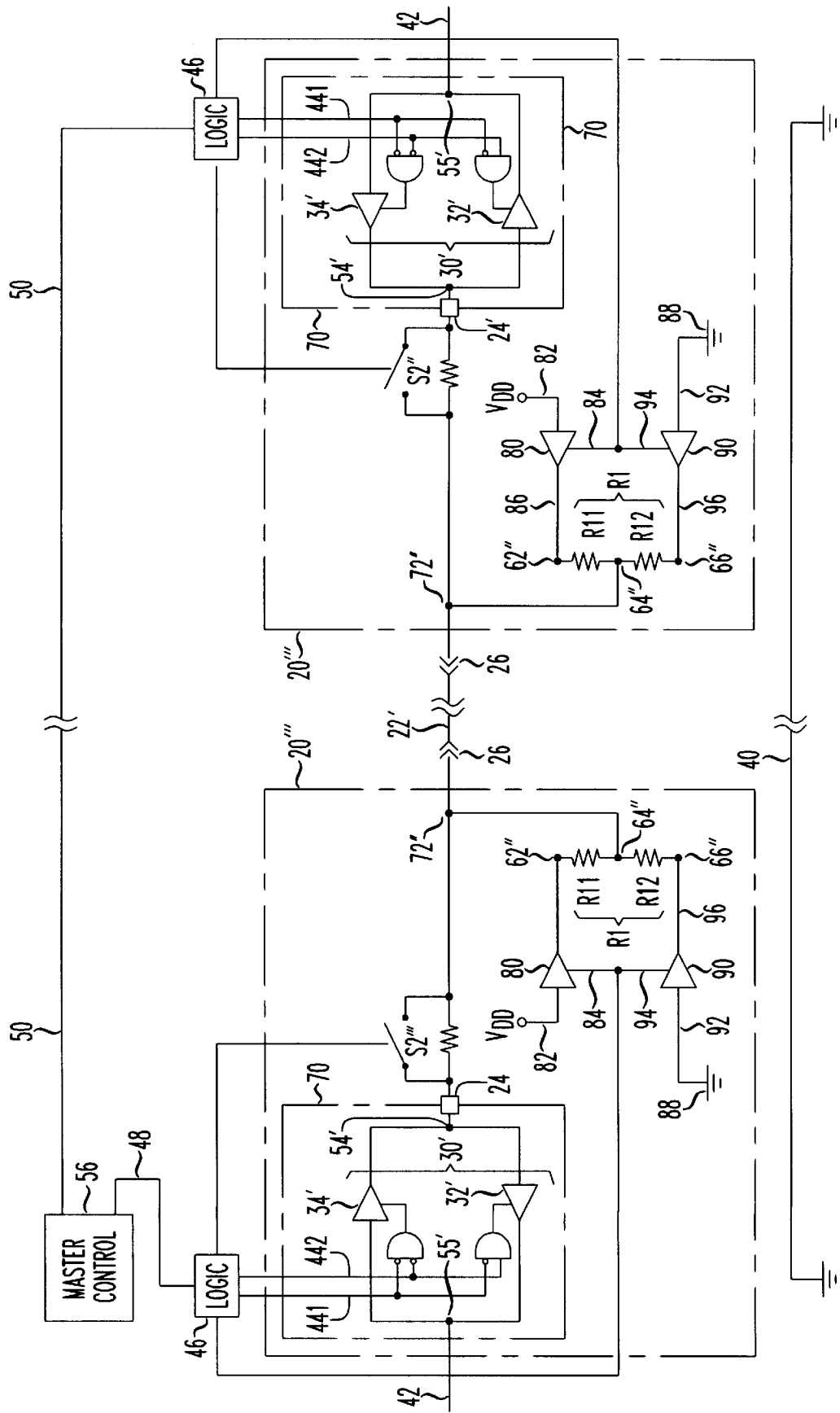
FIG. 4 is a schematic diagram of yet another alternative embodiment active termination circuit.

FIG. 4 illustrates an active termination circuit 20''' including an alternative technique for switching the first impedance R1. A first three-state buffer 80 has a first input 82 coupled to a voltage source such as $V_{DD}$, a second input 84 as a control input, and an output 86 coupled to first resistance R11 at node 62". A second three-state buffer 90 has a first input 92 coupled to a voltage reference 88, such as ground, a second input 94 as a control input, and an output 96 coupled to second resistance R12 at node 66". Three-state buffers 80 and 90 are switched to a low impedance state to couple resistance R1 to bidirectional conductor 22 and match the characteristic impedance thereof.

Only one of three-state buffers 80 and 90 needs to be switched from a high impedance state to a low impedance state with the other three-state buffer enabled to the low impedance state to effectively couple first impedance R1 to bidirectional conductor 22. As in the embodiment shown in FIG. 1 and described above, it is not necessary to switch out both resistances R11 and R12 to effectively remove first impedance R1 from the circuit. Any configuration to isolate first impedance R1 from node 60 or to modify impedance R1 will suffice. For example, only one of resistors R11 or R12 needs to be effectively removed from the circuit to sufficiently change the resulting impedance.

Switches S1, S1', S1", S2, S2' S2" and S2''' may be any high speed electronic or electromechanical switch capable of switching sufficiently rapidly to meet requirements of the application, such as for example, a field effect transistor, a bipolar transistor, a silicon controlled rectifier, a circuit, a relay, an analog switch, an analog multiplexer or a Quick Switch® product manufactured by Quality Semiconductor, 851 Martin Avenue, Santa Clara, Calif. 95050. The latter devices are particularly useful because they can terminate multiple conductors in a cable due to being configured in groups, for example, 8, 9, 10 or 20 to simultaneously switch a plurality of conductors. Such a product can be used to switch in or out a plurality of resistors, such as R1 and R2.

While the invention has been described as having a switched coupled between the second impedance and the common node, the specific location of the switch or the number of switches, is not limiting. One could architecturally move the switch beyond the common node toward the individual resistances to provide two switches, for example, coupled either between the resistors and the common node or between the resistors and the reference voltages to which they are coupled, in any combination.

While the active termination circuit has been described as being coupled to a bidirectional conductor, it is recognized that the active termination circuit is adapted to be coupled to the bidirectional conductor and is adapted to receive a signal to be transmitted or received and is adapted to be controlled. Conductors 40 and 50 may traverse the same cable as conductor 22 or 22'. The transmitter and receiver shown in FIGS. 2, 3 or 4 could be replaced with transmitters and receivers having independently accessible inputs and outputs. Similarly, the configuration of impedances and switches illustrated in FIGS. 3 and 4 could be employed with transmitters and receivers having independently accessible inputs and outputs.

The invention claimed is:

1. An active termination circuit, comprising:
   a transmitter operable in a transmit mode and an idle mode the transmitter having an output and defining an output impedance, the output of the transmitter adapted to be coupled to a conductor over which information is to be transmitted;
   a receiver operable in a receive mode and an idle mode, the receiver having an input and defining an input impedance, the input of the receiver adapted to be coupled to the conductor over which information is to be transmitted;
   a first impedance adapted to be switched to couple to the conductor to match the input impedance of the receiver to a characteristic impedance of the conductor when the active termination circuit is coupled thereto and the receiver is in the receive mode, the first impedance adapted to be switched to uncouple from the conductor when the receiver is in the idle mode; and
   a second impedance adapted to be switched in series with the transmitter output to match the output impedance of the transmitter to the characteristic impedance of the conductor when the active termination circuit is coupled thereto and the transmitter is in the transmit mode, the second impedance adapted to be switched to not be in series with the transmitter output when the transmitter is in the idle mode.

2. The circuit as recited in claim 1, further comprising:
   a first switch adapted to switch the first impedance between a first state which couples the first impedance to the conductor, and a second state which uncouples the first impedance from the conductor.

3. The circuit as recited in claim 2, wherein the first switch is an electronic switch.

4. The circuit as recited in claim 3, wherein the first switch comprises a three-state buffer.

5. The circuit as recited in claim 1, further comprising:
   a second switch adapted to switch the second impedance between a first state which couples the second impedance in series with the transmitter output, and a second state which removes the second impedance from being in series with the transmitter output.

6. The circuit as recited in claim 5, wherein the second switch is an electronic switch.

7. The circuit as recited in claim 1, wherein the transmitter and receiver each further comprise a control input, the control input of the transmitter adapted to control operation of the transmitter to be in the transmit mode when the control input takes on a first state and to be in the idle mode when the control input takes on a second state.

8. The circuit as recited in claim 7, further comprising:
   a first switch adapted to switch the first impedance between a first state which couples the first impedance to the conductor, and a second state which uncouples the first impedance from the conductor.

9. The circuit as recited in claim 7, further comprising:
   a second switch adapted to switch the second impedance between a first state which couples the second impedance in series with the transmitter output, and a second state which removes the second impedance from being in series with the transmitter output.

10. A circuit as recited in claim 8, further comprising:
    a second switch adapted to switch the second impedance between a first state which couples the second impedance in series with the transmitter output, and a second state which removes the second impedance from being in series with the transmitter output, wherein the control input is synchronized with the first and second switches such that the first and second impedances are switched simultaneously with the transmitter shifting between the transmit mode and the idle mode, and the receiver shifting between the idle mode and the receive mode.

11. A method of actively terminating a bi-directional conductor, comprising the steps of:
    switching a transmitter between a first mode and a second mode;
    switching a receiver between a third mode and a fourth mode, the transmitter being in the first mode when the receiver is in the fourth mode, and the receiver being in third mode when the transmitter is in second mode;
    switching a first impedance to be in series with the transmitter to match an output impedance of the transmitter to a characteristic impedance of the bidirectional conductor when the transmitter is coupled thereto when the transmitter is in the first mode; and
    switching a second impedance to couple the bidirectional conductor to match an input impedance of the receiver to the characteristic impedance of the bidirectional conductor when the receiver is in the third mode.

12. An integrated circuit including an active termination circuit, comprising:
    a transmitter operable in a transmit mode and an idle mode the transmitter having an output and defining an output impedance, the output of the transmitter adapted to be coupled to a conductor over which information is to be transmitted;
    a receiver operable in a receive mode and an idle mode, the receiver having an input and defining an input impedance, the input of the receiver adapted to be coupled to the conductor over which information is to be transmitted;
    a first impedance adapted to be switched to couple to the conductor to match the input impedance of the receiver to a characteristic impedance of the conductor when the active termination circuit is coupled thereto and the receiver is in the receive mode, the first impedance adapted to be switched to uncouple from the conductor when the receiver is in the idle mode; and a second impedance adapted to be switched in series with the transmitter output to match the output impedance of the transmitter to the characteristic impedance of the conductor when the active termination circuit is coupled thereto and the transmitter is in the transmit mode, the second impedance adapted to be switched to not be in series with the transmitter output when the transmitter is in the idle mode.

13. The integrated circuit as recited in claim 12, further comprising:

a first switch adapted to switch the first impedance between a first state which couples the first impedance to the conductor, and a second state which uncouples the first impedance from the conductor.

14. The integrated circuit as recited in claim 13, wherein the first switch is an electronic switch.

15. The integrated circuit as recited in claim 13, wherein the first switch comprises a three-state buffer.

16. The integrated circuit as recited in claim 12, further comprising:

a second switch adapted to switch the second impedance between a first state which couples the second impedance in series with the transmitter output, and a second state which removes the second impedance from being in series with the transmitter output.

17. The integrated circuit as recited in claim 16, wherein the second switch is an electronic switch.

18. The integrated circuit as recited in claim 12, wherein the transmitter and receiver each further comprise a control input, the control input of the transmitter adapted to control operation of the transmitter to be in the transmit mode when the control input takes on a first state and to be in the idle mode when the control input takes on a second state.

19. The integrated circuit as recited in claim 18, further comprising:

a first switch adapted to switch the first impedance between a first state which couples the first impedance to the conductor, and a second state which uncouples the first impedance from the conductor.

20. The integrated circuit as recited in claim 18, further comprising:

a second switch adapted to switch the second impedance between a first state which couples the second impedance in series with the transmitter output, and a second state which removes the second impedance from being in series with the transmitter output.

21. The integrated circuit as recited in claim 19, further comprising:

a second switch adapted to switch the second impedance between a first state which couples the second impedance in series with the transmitter output, and a second state which removes the second impedance from being in series with the transmitter output, wherein the control input is synchronized with the first and second switches such that the first and second impedances are switched simultaneously with the transmitter shifting between the transmit mode and the idle mode, and the receiver shifting between the idle mode and the receive mode.

22. A system for active termination of a circuit, comprising:

a first active termination circuit coupled to a first end of a conductor, a second active termination circuit coupled to a second end of a conductor, at least one of the first and second active termination circuits comprising:

a transmitter operable in a transmit mode and an idle mode the transmitter having an output and defining an output impedance, the output of the transmitter adapted to be coupled to a conductor over which information is to be transmitted;

a receiver operable in a receive mode and an idle mode, the receiver having an input and defining an input impedance, the input of the receiver adapted to be coupled to the conductor over which information is to be transmitted;

a first impedance adapted to be switched to couple to the conductor to match the input impedance of the receiver to a characteristic impedance of the conductor when the active termination circuit is coupled thereto and the receiver is in the receive mode, the first impedance adapted to be switched to uncouple from the conductor when the receiver is in the idle mode; and a second impedance adapted to be switched in series with the transmitter output to match the output impedance of the transmitter to the characteristic impedance of the conductor when the active termination circuit is coupled thereto and the transmitter is in the transmit mode, the second impedance adapted to be switched to not be in series with the transmitter output when the transmitter is in the idle mode.

23. The system as recited in claim 22, wherein said at least one active termination circuit further comprises:

a first switch adapted to switch the first impedance between a first state which couples the first impedance to the conductor, and a second state which uncouples the first impedance from the conductor.

24. The system as recited in claim 23, wherein the first switch is an electronic switch.

25. The system as recited in claim 23, wherein the first switch comprises a three-state buffer.

26. The system as recited in claim 23, wherein said at least one active termination circuit further comprises:

a second switch adapted to switch the second impedance between a first state which couples the second impedance in series with the transmitter output, and a second state which removes the second impedance from being in series with the transmitter output.

27. The system as recited in claim 26, wherein the second switch is an electronic switch.

28. The system as recited in claim 22, wherein the transmitter and receiver each further comprise a control input, the control input of the transmitter adapted to control operation of the transmitter to be in the transmit mode when the control input takes on a first state and to be in the idle mode when the control input takes on a second state.

29. The system as recited in claim 28, wherein said at least one active termination circuit further comprises:

a first switch adapted to switch the first impedance between a first state which couples the first impedance to the conductor, and a second state which uncouples the first impedance from the conductor.

30. The system as recited in claim 29, further comprising:
a second switch adapted to switch the second impedance between a first state which couples the second impedance in series with the transmitter output, and a second state which removes the second impedance from being in series with the transmitter output.

31. The system as recited in claim 29, wherein said at least one active termination circuit further comprises:

a second switch adapted to switch the second impedance between a first state which couples the second impedance in series with the transmitter output, and a second state which removes the second impedance from being in series with the transmitter output, wherein the control input is synchronized with the first and second switches such that the first and second impedances are switched simultaneously with the transmitter shifting between the transmit mode and the idle mode, and the receiver shifting between the idle mode and the receive mode.

* * * * *